US005761313A

United States Patent [19]

Schott

[11] Patent Number: 5,761,313

[45] Date of Patent: Jun. 2, 1998

[54] CIRCUIT FOR IMPROVING THE STEREO IMAGE SEPARATION OF A STEREO SIGNAL

[75] Inventor: Wayne Milton Schott, Seymour, Tenn.

[73] Assignee: Philips Electronics North America Corp., New York, N.Y.

[21] Appl. No.: 497,316

[22] Filed: Jun. 30, 1995

[51] Int. Cl.$^6$ .................. H04R 5/00; H03G 5/00

[52] U.S. Cl. .................. 381/1; 381/17; 381/63; 381/103

[58] Field of Search .................. 381/1, 17, 98, 381/103, 18, 19, 20, 63

[56] References Cited

U.S. PATENT DOCUMENTS

| | | | |
|---|---|---|---|
| 4,308,423 | 12/1981 | Cohen . | |
| 4,329,544 | 5/1982 | Yamada | 381/17 |
| 4,349,698 | 9/1982 | Iwahara | 381/1 |
| 4,356,349 | 10/1982 | Robinson . | |
| 4,739,513 | 4/1988 | Kunugi et al. | 381/103 |
| 4,748,669 | 5/1988 | Klayman . | |
| 4,837,824 | 6/1989 | Orban . | |
| 4,893,342 | 1/1990 | Cooper et al. . | |
| 4,910,779 | 3/1990 | Cooper et al. . | |
| 4,975,954 | 12/1990 | Cooper et al. . | |
| 5,034,983 | 7/1991 | Cooper et al. . | |
| 5,046,097 | 9/1991 | Lowe et al. . | |
| 5,136,651 | 8/1992 | Cooper et al. . | |
| 5,333,200 | 7/1994 | Cooper et al. . | |
| 5,337,363 | 8/1994 | Platt . | |
| 5,381,482 | 1/1995 | Matsumoto et al. . | |
| 5,404,406 | 4/1995 | Fuchigami et al. . | |
| 5,412,731 | 5/1995 | Desper . | |
| 5,414,774 | 5/1995 | Yumoto | 381/1 |
| 5,434,921 | 7/1995 | Dombrowski, Jr. et al. | 381/1 |
| 5,524,290 | 6/1996 | Ecklund et al. | 381/103 |
| 5,540,638 | 7/1996 | Lowe et al. | 381/1 |
| 5,581,626 | 12/1996 | Palmer | 381/103 |
| 5,657,391 | 8/1997 | Jyosako | 381/63 |
| 5,661,808 | 8/1997 | Klayman | 381/103 |

FOREIGN PATENT DOCUMENTS

| | | | |
|---|---|---|---|
| 56001698A | 6/1979 | Japan . | |
| 59049100A | 9/1982 | Japan . | |
| 4150211 | 5/1992 | Japan | 381/103 |
| 05208873 | 7/1993 | Japan . | |

*Primary Examiner*—Curtis A. Kuntz
*Assistant Examiner*—Xu Mei
*Attorney, Agent, or Firm*—Michael E. Belk

[57] ABSTRACT

By using special frequency response manipulation in the difference channel of a stereo signal, the stereo image will appear to extend beyond the actual placement of the loudspeakers. This is accomplished by shaping the difference channel response to simulate the response one would be subjected to if the sources were physically moved to the virtual positions. The circuit includes a summing and high frequency equalization circuit to which the left and right stereo signals are applied, and a difference forming and human ear equalization circuit also to which the left and right stereo signals are applied. The outputs from these circuits are cross-coupled to form left and right channel outputs.

4 Claims, 11 Drawing Sheets

CIRCUIT FOR IMPROVING THE STEREO IMAGE SEPARATION OF A STEREO SIGNAL

BACKGROUND OF THE INVENTION

1. Field of the Invention

The subject invention relates to a signal processing circuit for enhancing a stereo image that corresponds to a stereo audio signal.

2. Description of the Related Art

In conventional stereo systems, the amplifying circuits amplify the left and right channel signals and pass these amplified signals to a left and right channel loudspeakers. This is done in an attempt to simulate the experience of a live performance in which the reproduced sounds emanate from different locations. Since the advent of stereo systems, there has been continual development of systems which more closely simulate this experience of a live performance. For example, in the early to mid 1970's, four-channel stereo systems were developed which included two front left and right channel loudspeakers and two rear left and right channel speakers. These systems attempted to recapture the information contained in signals reflected from the back of a room in which a live performance was being held. More recently, surround sound systems are currently on the market which, in effect, seek to accomplish the same effect.

A drawback of these systems is that there are four or more channels of signals being generated and a person must first purchase the additional loudspeakers and then solve the problem of locating the multiple loudspeakers for the system.

As an alternative to such a system, U.S. Pat. No. 4,748,669 to Klayman discloses a stereo enhancement system which simulates this wide dispersal of sound while only using the two stereo loudspeakers. This system, commonly known as the Sound Retrieval System, uses dynamic equalizers, which boost the signal level of quieter components relative to louder components, a spectrum analyzer and a feedback and reverberation control circuit to achieve the desired effect. However, as should be apparent, this system is relatively complex and costly to implement.

SUMMARY OF THE INVENTION

It is an object of the subject invention to provide a signal processing circuit for enhancing a stereo image that corresponds to a stereo audio signal that is relatively simple and inexpensive.

This object is achieved in a circuit arrangement for improving the stereo image separation in a stereo signal comprising a first and a second input for receiving, respectively, a left and a right channel signal of an input stereo signal; a summing and equalizing circuit having a first and a second input coupled, respectively, to said first and second inputs of said circuit arrangement, for receiving said left and right channel signals, means for summing the left and right channel signals thereby forming a sum signal, equalizing means for performing a high frequency equalization on said sum signal, and a first and a second output both for supplying the equalized sum signal; a difference and equalizing circuit having a first and a second input coupled, respectively, to said first and second inputs, for receiving said left and right channel signals, means for subtracting the right channel signal from the left channel signal thereby forming a first difference signal, means for subtracting the left channel signal from the right channel signal thereby forming a second difference signal, means for performing an equalization on said first and second difference signals, said equalization having characteristics of an ear of a human being, and first and second outputs for providing, respectively, the equalized first difference signal and the equalized second difference signal; first means for combining the first output of said summing and equalizing circuit with the first output of said difference and equalizing circuit, an output of said first combining means carrying a modified left channel signal and being coupled to a first output of said circuit arrangement; and second means for combining the second output of said summing and equalizing circuit with the second output of said difference and equalizing circuit, an output of said second combining means carrying a modified right channel signal and being coupled to a second output of said circuit arrangement.

Applicant has found that by using simple matrixing and frequency response shaping, a wide degree of stereo spread may be achieved in which the perceived spread of the stereo signal is significantly wider than the actual placement of the loudspeakers. This is particularly advantageous in compact audio systems and television receivers in which there is a limited amount of separation between the left and right channel loudspeakers.

BRIEF DESCRIPTION OF THE DRAWINGS

With the above and additional objects and advantages in mind as will hereinafter appear, the invention will be described with reference to the accompanying drawings, in which.

DESCRIPTION OF THE PREFERRED EMBODIMENTS

Figure 1:
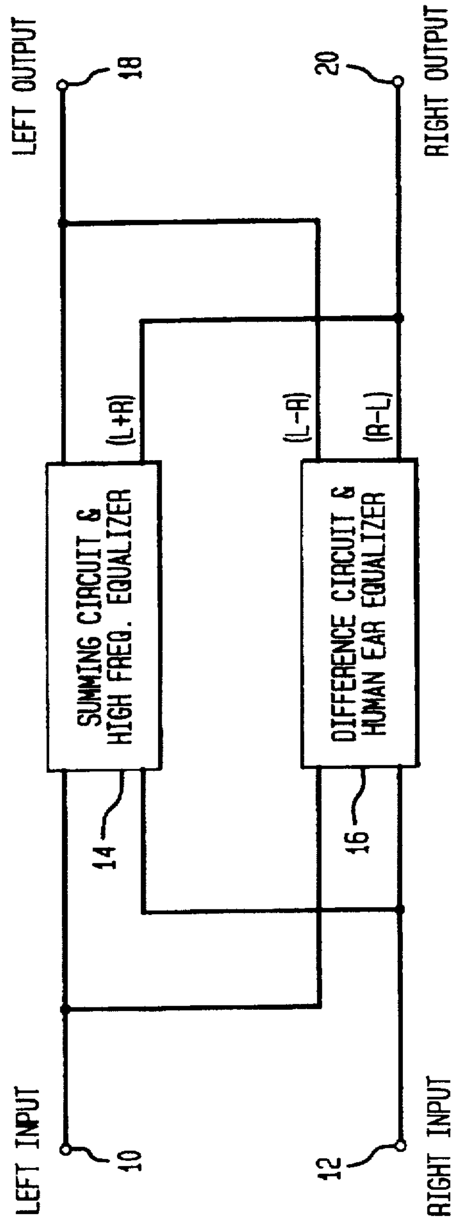
FIG. 1 shows a schematic block diagram of the circuit of the subject invention.

FIG. 1 shows a basic schematic block diagram of the subject invention. A first and a second input 10 and 12 receive the left and right channel signals from a stereo signal source. The left channel signal is applied both to a first input of a summing and frequency equalizing circuit 14 and to a first input of a difference and frequency equalizing circuit 16. The right channel signal is similarly applied both to a second input of the summing and frequency equalizing circuit 14 and to a second input of the difference and frequency equalizing circuit 16. The summing and frequency equalizing circuit 14 adds the signals applied to its first and second inputs and then optionally performs a high frequency equalization on the combined signal (L+R). This combined signal is then supplied to a first and a second output of the summing and frequency equalizing circuit 14.

The difference and frequency equalizing circuit 16 forms a first difference signal (L−R) and a second difference signal (R−L). This circuit 16 then performs a frequency equalization, with respect to the response of the ear of a person on these difference signals to shape the response to simulate that which would be perceived by the if the sound sources (loudspeakers) were actually placed at virtual positions, i.e., wider and directly opposite the person's ears. The equalized first and second difference signals are then applied to first and second outputs of the difference and frequency equalizing circuit 16.

The first output of the summing and frequency equalizing circuit 14 is then combined with the first output of the difference and frequency equalizing circuit 16 forming a first output 18 of the circuit arrangement carrying a modified left channel signal. Similarly, the second output of the summing and frequency equalizing circuit 14 is combined with the second output of the difference and frequency equalizing circuit 16 forming a second output 20 of the circuit arrangement carrying a modified right channel signal.

Figure 2:
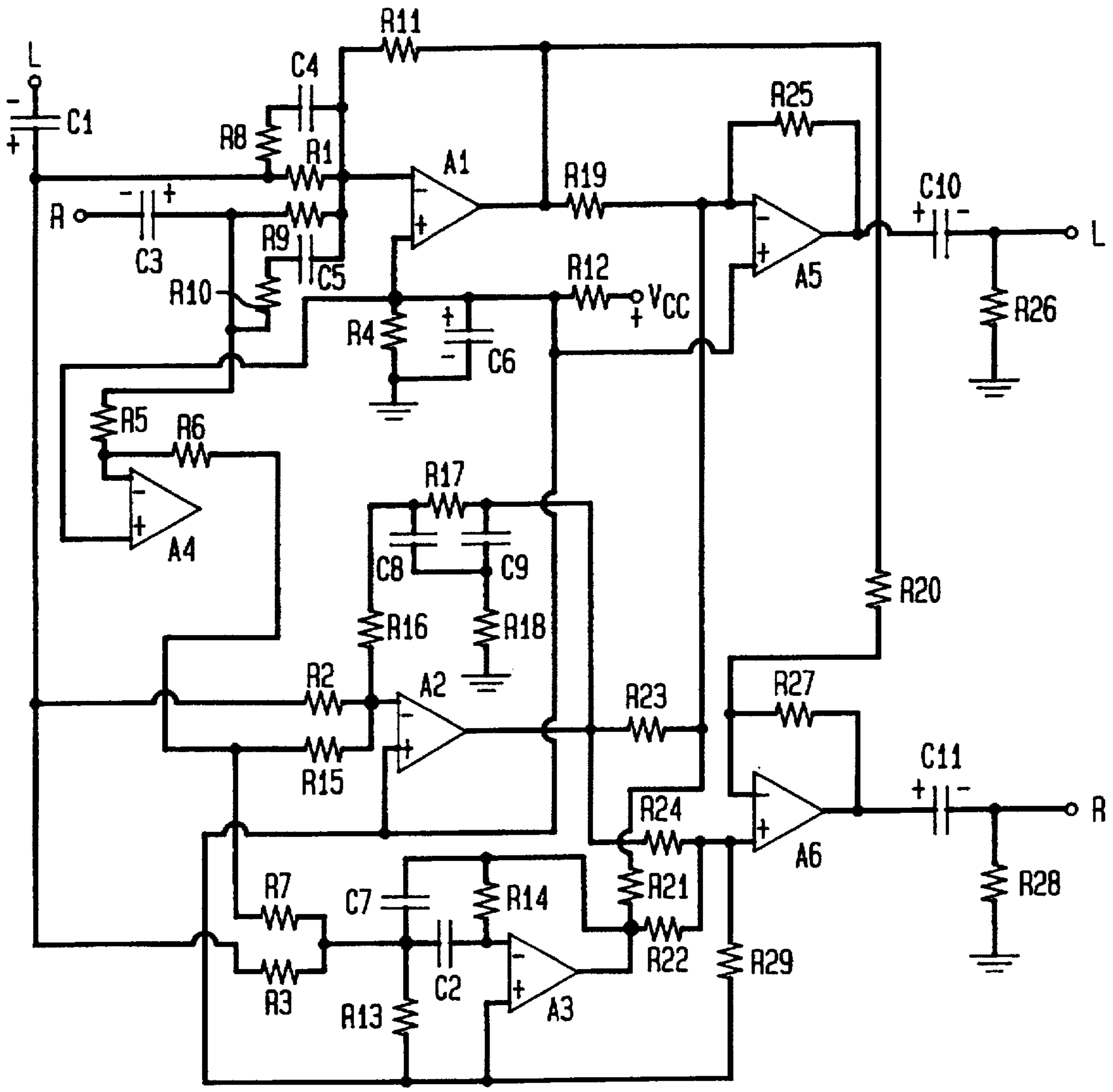
FIG. 2 shows a schematic diagram of a first embodiment of the subject invention.

FIG. 2 shows a schematic diagram of a first embodiment of the circuit arrangement of FIG. 1. The left channel input of the circuit is applied to a capacitor C1 and then through a resistor R1 to the inverting input of a first operational amplifier (OP-AMP) A1, through a resistor R2 to the inverting input of a second OP-AMP A2, and through a resistor R3 and a capacitor C2 to the inverting input of OP-AMP A3. The non-inverting input of OP-AMP A1 is connected to ground via a resistor R4.

The right channel signal is applied to a capacitor C3 and then through a resistor R5 to the inverting input of OP-AMP A4. A resistor R6 couples the inverting input to the output of OP-AMP A4, which is then coupled, through a resistor R7 to the capacitor C2 connected to the inverting input of OP-AMP A3.

The left channel signal at the output of capacitor C1 is also applied to a series arrangement of a resistor R8 and a capacitor C4 which, in combination with the right channel signal at the output of capacitor C3 after having passed through a resistor R9 coupling the right channel input to the inverting input of OP-AMP A1, on the one hand, and a series arrangement of a resistor R10 and a capacitor C5, is coupled to a resistor R11 connected to the output of OP-AMP A1. A voltage source Vcc is coupled to the circuit through a resistor R12. The resistor R12 is connected to ground via a capacitor C6, to the non-inverting input of OP-AMP A1, and to the non-inverting input of OP-AMP A4. The resistor R12 is further connected to the non-inverting inputs of OP-AMPs A2 and A3, and via a resistor R13 to capacitor C2. The output of OP-AMP A3 is connected to its inverting input via a resistor R14 and to capacitor C2 via a capacitor C7.

The output of OP-AMP A4 is also connected to the inverting input of OP-AMP A2 via a resistor R15 which is, in turn, connected to the output of OP-AMP A2 via the series arrangement of resistors R16 and R17, the junction between resistors R16 and R17 being connected to ground via a series arrangement of a capacitor C8 and a resistor R18, while the output of OP-AMP A2 is connected to ground via a series arrangement of a capacitor C9 and the resistor R18.

The output from OP-AMP A1 is connected via resistor R19 to the inverting input of OP-AMP A5, and via a resistor R20 to the inverting input of OP-AMP A6. The output from OP-AMP A3 is connected via a resistor R21 to the inverting input of OP-AMP A5, and via a resistor R22 to the non-inverting input of OP-AMP A6. The output of OP-AMP A2 is connected via resistor R23 to the inverting input of OP-AMP A5, and via resistor R24 to the non-inverting input of OP-AMP A6. Resistor R12, connecting to the voltage source Vcc, is connected to the non-inverting input of OP-AMP A5, and to the non-inverting input of OP-AMP A6 via a resistor R29.

The inverting input of OP-AMP A5 is connected to its output via a resistor R25, which is then connected through a capacitor C10 to ground via a resistor R26 and to the left channel output of the circuit. Similarly, the inverting input of OP-AMP A6 is connected to its output via a resistor R27, which is then connected through a capacitor C11 to ground via a resistor R28 and to the right channel output of the circuit.

In FIG. 2, OP-AMP A1 acts as the summing portion of circuit 14 of FIG. 1 for summing the left and right channel signals. OP-AMP A4 acts as an inverter for the right channel input signal, and a difference between the left and right channel signals being formed at the inverting input of OP-AMP A2. OP-AMP A2 operates as a mid-range human ear equalizer while OP-AMP A3 operates as a high-range human ear equalizer (parts of circuit 16 of FIG. 1). Finally, OP-AMPs A5 and A6 operate as a matrixing circuit for combining the (L+R) and (L–R), (R–L) signals thereby forming the left and right channel outputs.

Figure 3:
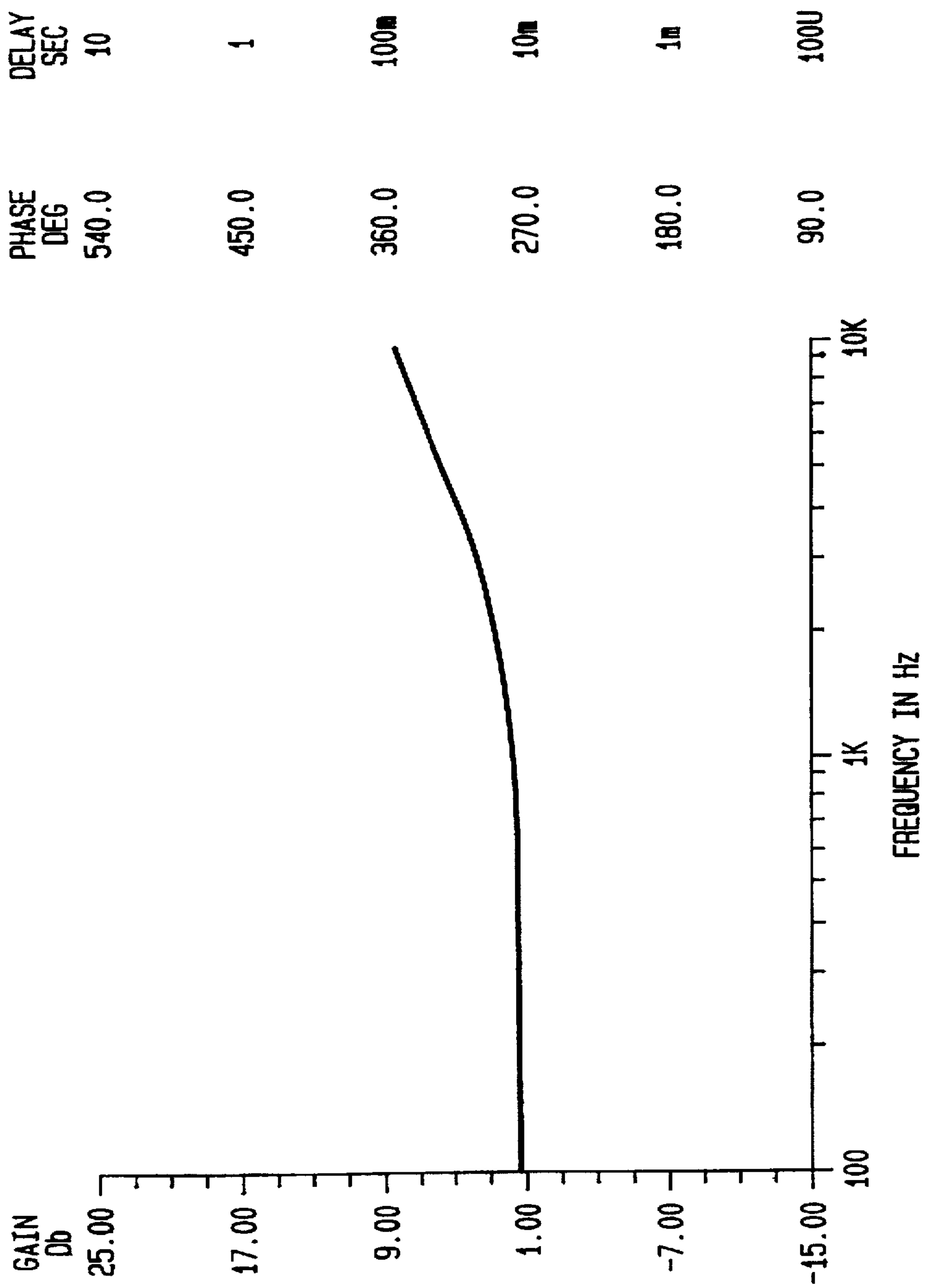
FIGS. 3–6 show response curves for various signals in the circuit of FIG. 2.
Figure 4:
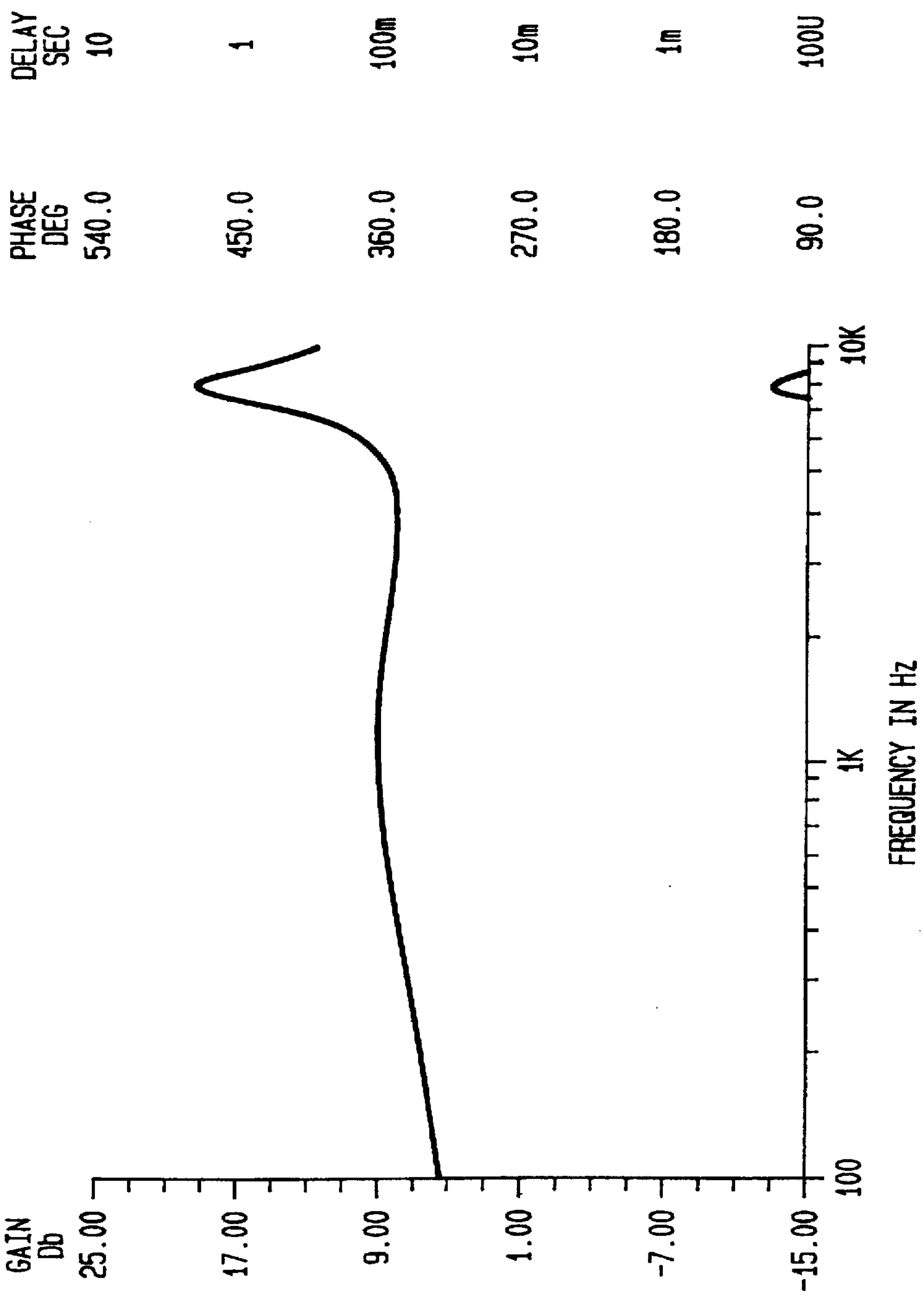
Figure 5:
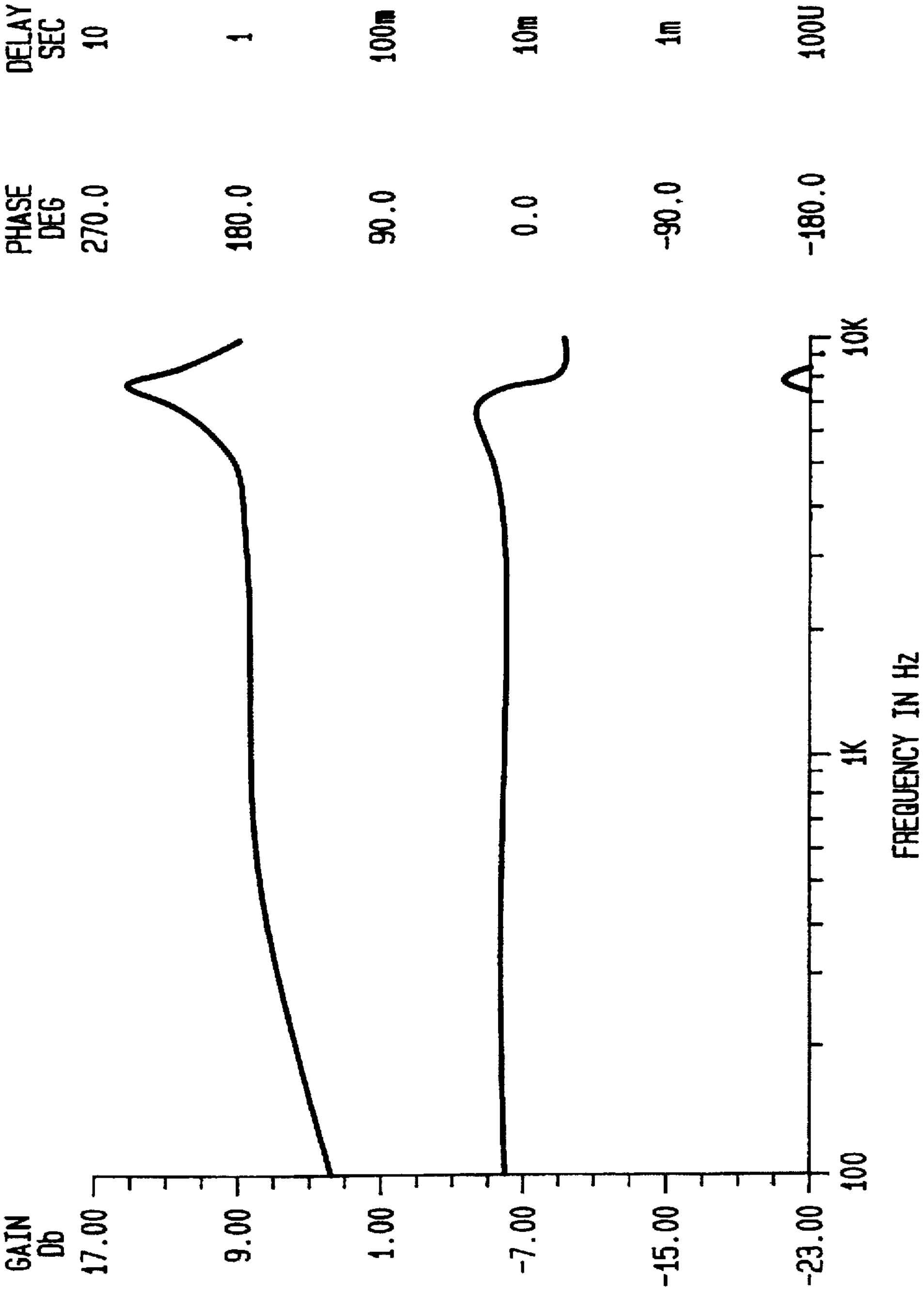
Figure 6:
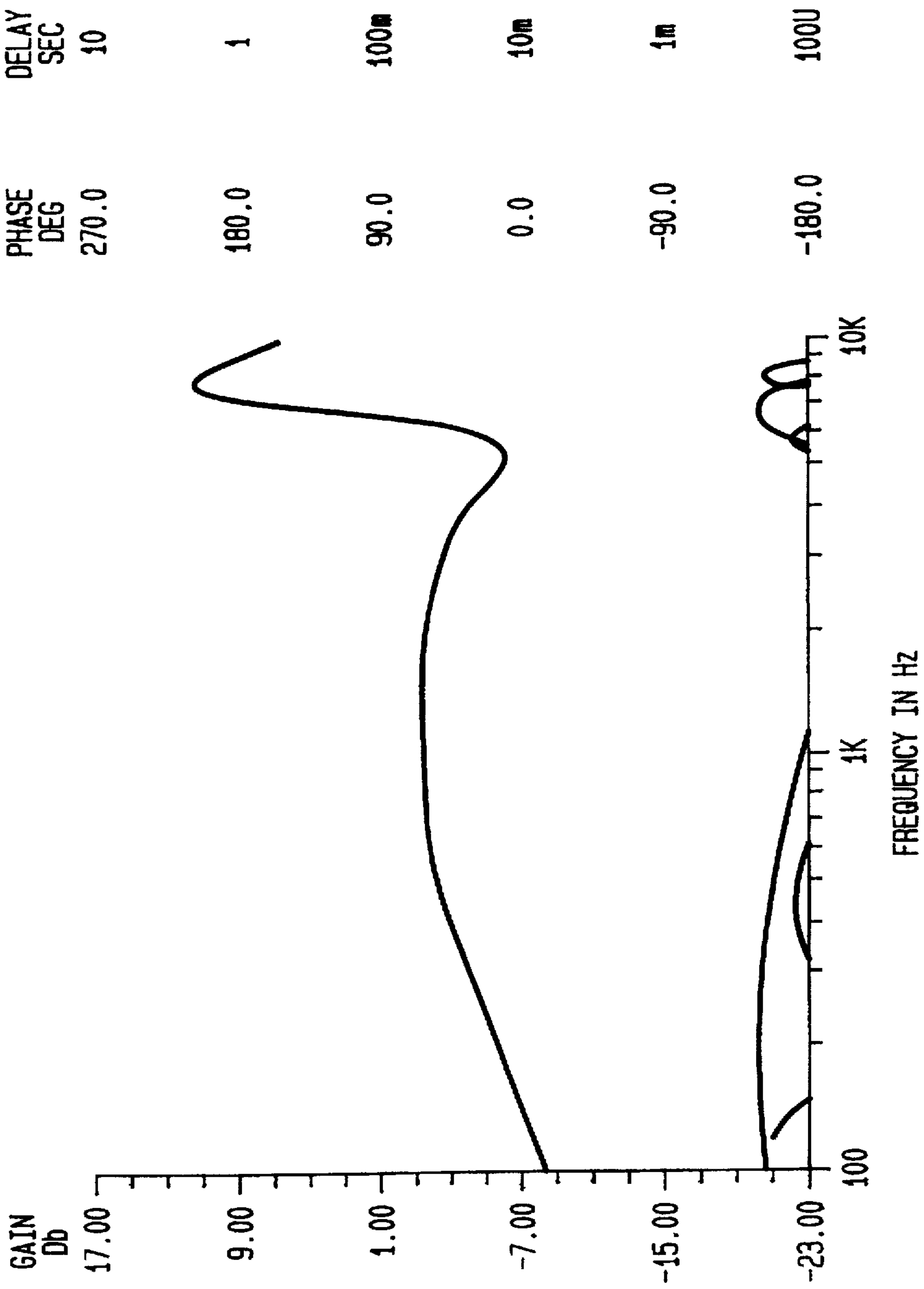

FIG. 3 shows a response curve of the signal (L+R) at the output of OP-AMP A1 (which is applied to OP-AMP A5 and OP-AMP A6), while FIG. 4 shows a response curve of the signal (L–R) at the junction of resistors R21 (from OP-AMP A2) and R23 (from OP-AMP A3). FIG. 5 shows response curves of the left channel input and the left channel output of the circuit of FIG. 2, while FIG. 6 shows response curves of the left channel input and the right channel output of the circuit of FIG. 2.

Figure 7:
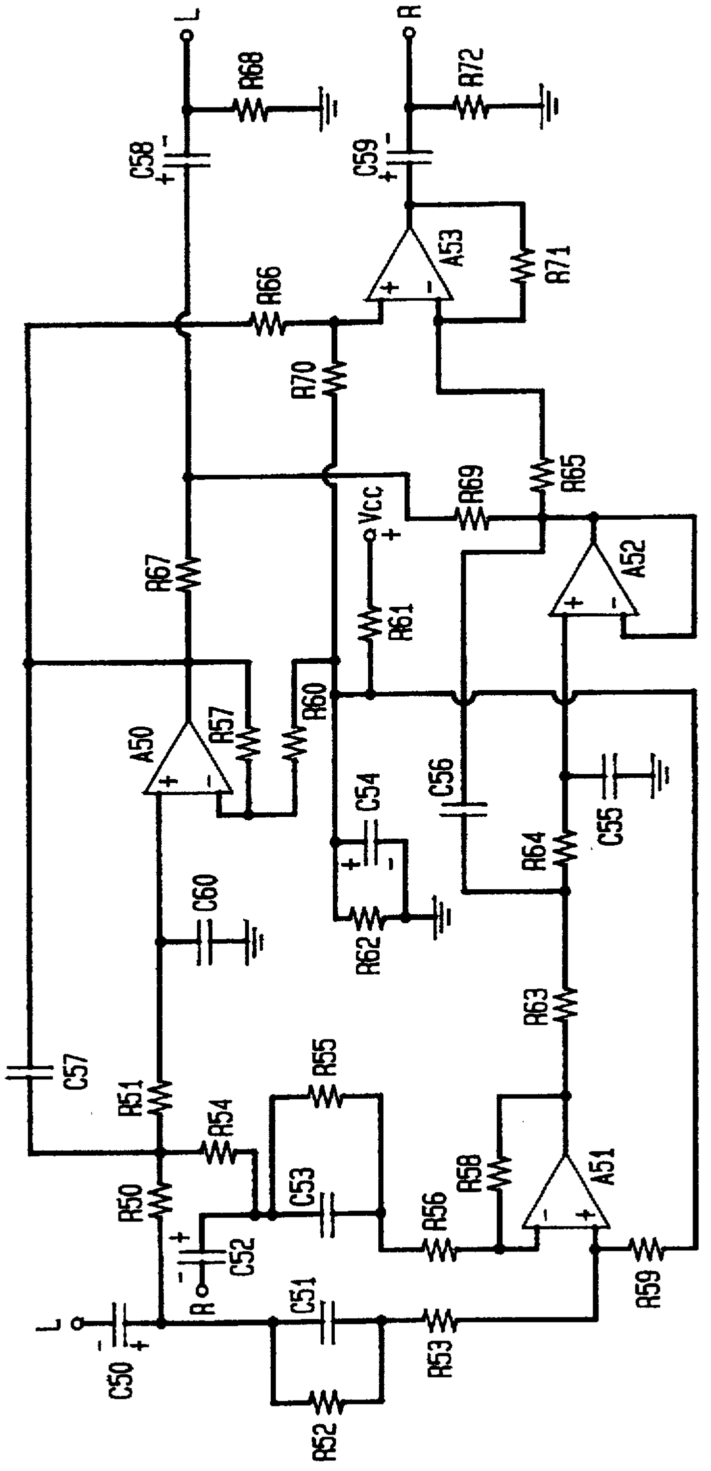
FIG. 7 shows a schematic diagram of a second embodiment of the invention.

FIG. 7 shows a second embodiment of the invention in which, instead of two separate tuned filters (equalizers) in the difference channel, the functions are combined by using a shelving circuit in conjunction with a peaked low-pass filter to achieve a response similar to that of FIG. 2.

In particular, the left channel input of the circuit is applied to a capacitor C50 and then through a series arrangement of resistors R50 and R51 to the non-inverting input of OP-AMP A50, this non-inverting input being coupled to ground through a capacitor C60. The left channel signal at the output of capacitor C50 is also applied to a parallel arrangement of a resistor R52 and a capacitor C51, and then to a resistor R53 which is connected to the non-inverting input of OP-AMP A51.

The right channel input of the circuit is applied to a capacitor C52 and then through a resistor R54 to the junction between resistors R50 and R51. The right channel signal at the output of capacitor C52 is also applied to a parallel arrangement of a resistor R55 and a capacitor C53, and then to a resistor R56 which is connected to the inverting input of OP-AMP A51. A resistor R57 connects the output of OP-AMP A50 to its inverting input, while a resistor R58 connects the output of OP-AMP A51 to its inverting input.

The non-inverting input of OP-AMP A51 is connected, through a series arrangement of resistors R59 and R60, to the inverting input of OP-AMP A50, the junction between resistors R59 and R60 being connected to a voltage source Vcc via a resistor R61, and to ground via a parallel arrangement of a resistor R62 and a capacitor C54.

The output of OP-AMP A51 is connected via a series arrangement of resistors R63 and R64 to the non-inverting input of OP-AMP A52, this non-inverting input also being connected to ground via a capacitor C55. The output of OP-AMP A52 is connected to its inverting input, to the junction of resistors R63 and R64 via a capacitor C56, and to the inverting input of OP-AMP A53 via a resistor R65.

The output of OP-AMP A50 is connected to the junction between resistors R50 and R51 via a capacitor C57, to the non-inverting input of OP-AMP A53 via a resistor R66, and to the left channel output of the circuit via a series arrangement of a resistor R67 and a capacitor C58, this left channel output being connected to ground by a resistor R68. The output of OP-AMP A52 is further connected to the junction between resistor R67 and capacitor C58 via a resistor R69. The junction between resistors R59 and R60 is also connected to the non-inverting input of OP-AMP A53 via a resistor R70.

Finally the output of OP-AMP A53 is connected to its inverting input via a resistor R71, and to the right channel output of the circuit via a capacitor C59, this right channel output being connected to ground via a resistor R72.

The left and right channel signals are summed at the junction of resistors R50 and R54 and then applied to the non-inverting input of OP-AMP A50 which then performs the high frequency equalization on the summed signal. The left and right channel signals are also applied to the non-inverting and inverting inputs, respectively, of OP-AMP A51 via R52, R53, R55, R56, C51 and C53, which forms the difference of these signals. The output of OP-AMP A51 is applied to OP-AMP A52 which, in combination with the resistors and capacitors connected thereto, performs the peaked low-pass filtering of the difference signal (i.e., the human ear equalization). This processed difference signal (L−R) is combined with the output (L+R) from OP-AMP A50 and the combined signal forms the left channel output of the circuit. In addition, the output from OP-AMP A52 (L−R) is applied to the inverting input (effectively forming R−L) of OP-AMP A53 while the output from OP-AMP A50 (L+R) is applied to the non-inverting input of OP-AMP A53, whose output thus forms the right channel output of the circuit.

Figure 8:
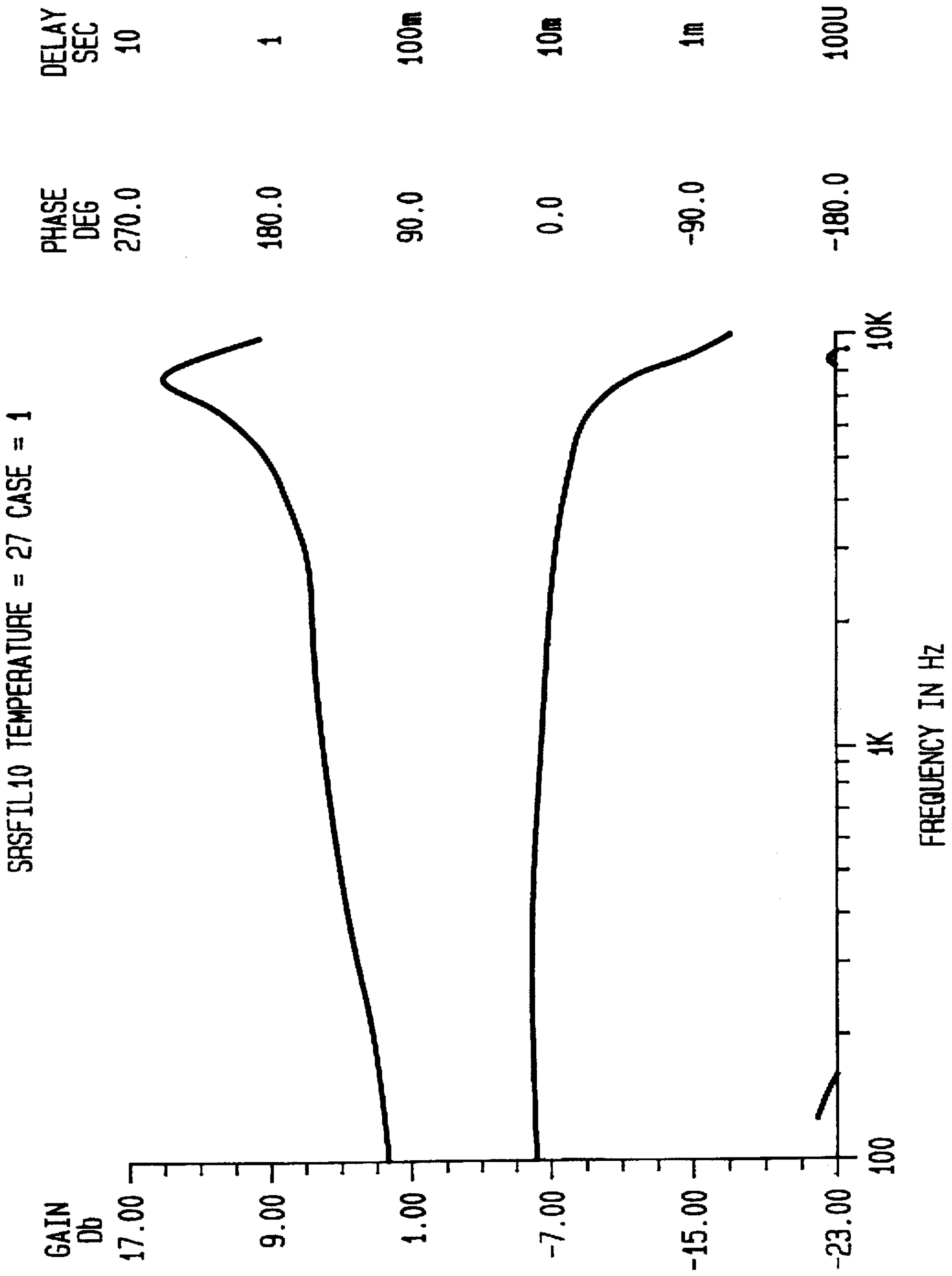
FIGS. 8 and 9 show response curves for various signals in the circuit of FIG. 7.
Figure 9:
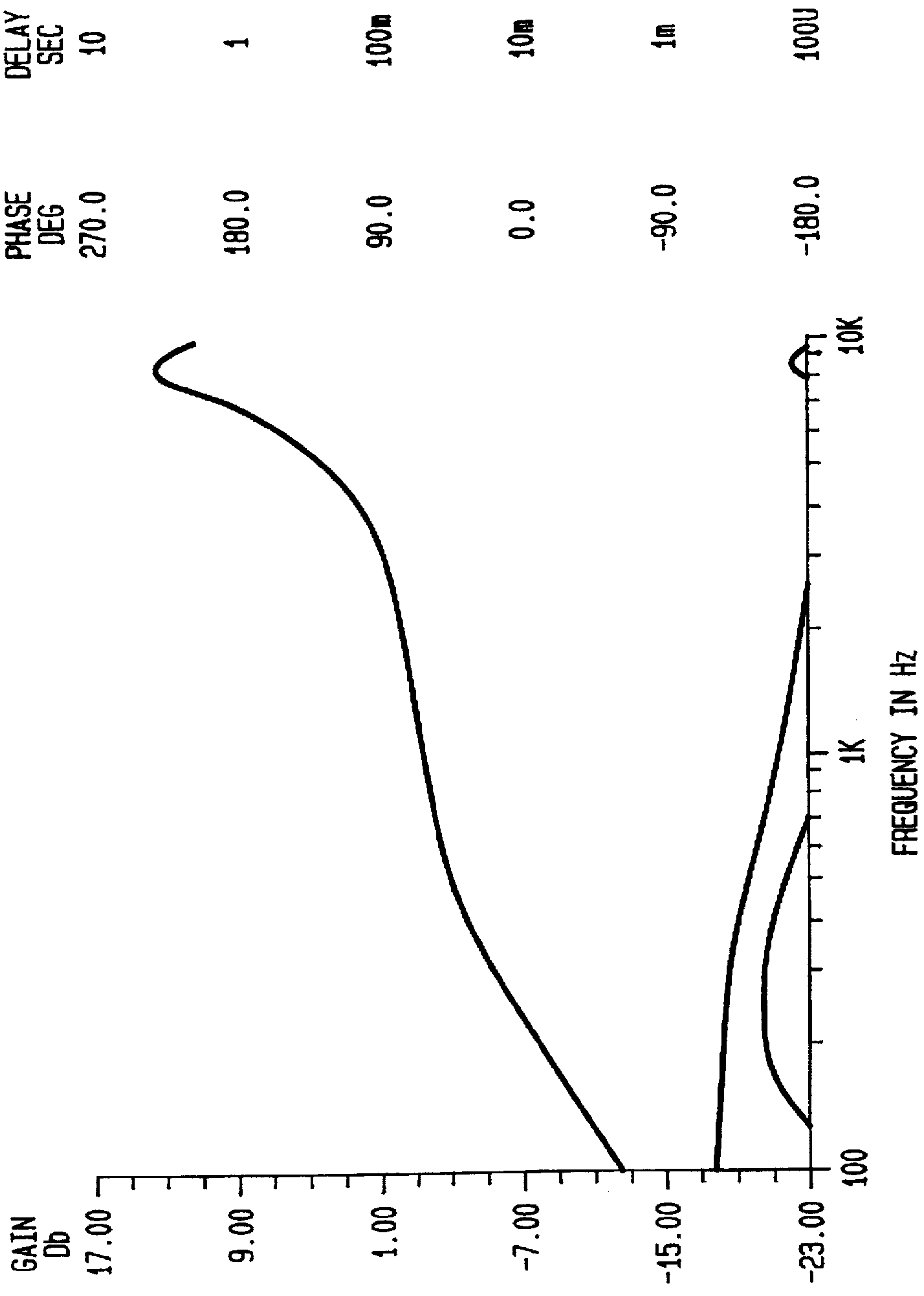

FIG. 8 shows response curves of the left channel input and the left channel output of the circuit of FIG. 7, while FIG. 9 shows response curves of the left channel input and the right channel output of the circuit of FIG. 7.

Figure 10:
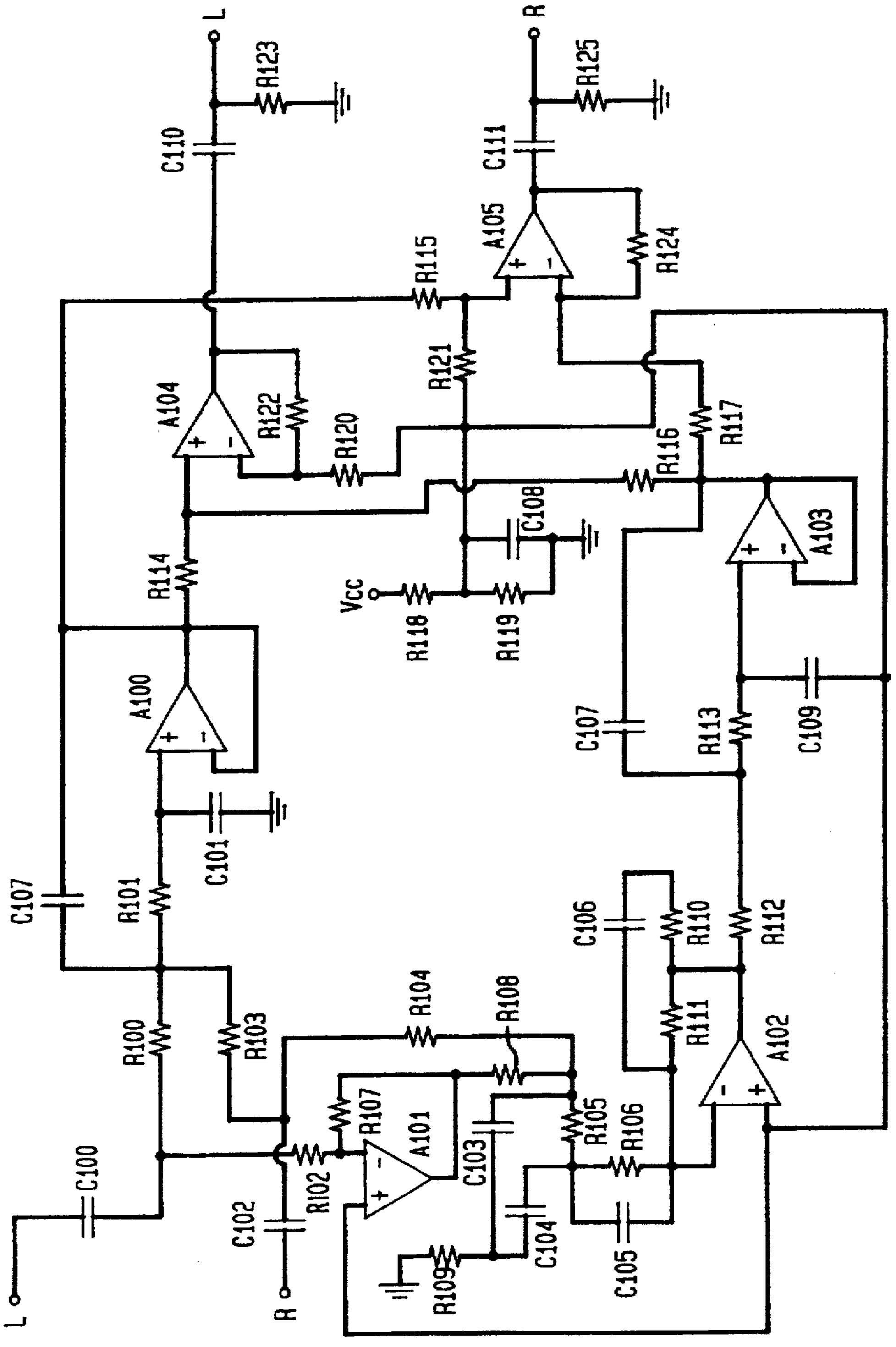
FIG. 10 shows a schematic diagram of a modification of the circuit of FIG. 2.

FIG. 10 shows a schematic diagram of another embodiment of the invention which, in effect, is a modification of the circuit of FIG. 2. In particular, the left channel input of the circuit is applied to a capacitor C100 and then through a series arrangement of resistors R100 and R101 to the non-inverting input of OP-AMP A100, this non-inverting input being connected to ground by a capacitor C101. The left channel input of the circuit from capacitor C100 is also applied via a resistor R102 to the inverting input of OP-AMP A101.

The right channel input is applied to a capacitor C102 and then through a resistor R103 to the junction between resistors R100 and R101. The right channel signal at the output of capacitor C102 is also applied via a series arrangement of resistors R104, R105 and R106 to the inverting input of OP-AMP A102. The output from OP-AMP A101 is connected to its inverting input by a resistor R107, and to the junction between R104 and R105 by a resistor R108. This junction is connected to ground by a series arrangement of a capacitor C103 and a resistor R109. The junction between resistors R105 and R106 is connected to the junction between capacitor C103 and resistor R108 by a capacitor C104, and is also connected to the inverting input of OP-AMP A102 by a capacitor C105.

The output of OP-AMP A102 is connected to its inverting input by a series arrangement of a resistor R110 and a capacitor C106, this series arrangement being in parallel with a resistor R111. The output of OP-AMP A102 is further connected to the non-inverting input of OP-AMP A103 by a series arrangement of resistors R112 and R113.

The output from OP-AMP A100 is connected to its inverting input, to the junction of resistors R100 and R101 via a capacitor C107, to the non-inverting input of OP-AMP A104 via a resistor R114, and to the non-inverting input of OP-AMP A105 via a resistor R115. The output of OP-AMP A103 is connected to its inverting input, to the non-inverting input of OP-AMP A104 via a resistor R116, and to the inverting input of OP-AMP A105 via a resistor R117.

A voltage source Vcc is applied to a resistor R118 and through a parallel combination of a resistor R119 and a capacitor C108 to ground. The junction between the resistor R118 and the parallel combination is connected to the inverting input of OP-AMP A104 via a resistor R120, to the non-inverting input of OP-AMP A105 via a resistor R121, to the non-inverting input of OP-AMP A103 via a capacitor C109, and to the non-inverting inputs of OP-AMPs A102 and A101.

The output from OP-AMP A104 is connected to its inverting input via a resistor R122 and to the left channel output of the circuit via a capacitor C110, this left channel output being connected to ground by a resistor R123. Similarly, the output from OP-AMP A105 is connected to its inverting input via a resistor R124, and to the right channel output of the circuit via a capacitor C111, this right channel output being connected to ground by a resistor R125.

The left and right channel signals are summed at the junction of resistor R100 and R102 and are subjected to high frequency equalization by OP-AMP A100 thus forming the processed sum signal (L+R). The left channel signal is inverted in OP-AMP A101 and is combined with the right channel signal at the junction of resistors R104 and R108 which is then subjected to the mid- and high- range equalization (human ear equalization) by the OP-AMPs A102 and A103. The output of OP-AMP A103, carrying the modified difference signal (L−R), is combined with the output from OP-AMP A100, carrying the modified sum signal (L+R) and is processed in OP-AMP A104 thereby forming the left channel output. The output of OP-AMP A103 is also applied to the OP-AMP A105 along with the output of OP-AMP A100 which forms at its output the right channel signal.

Figure 11:
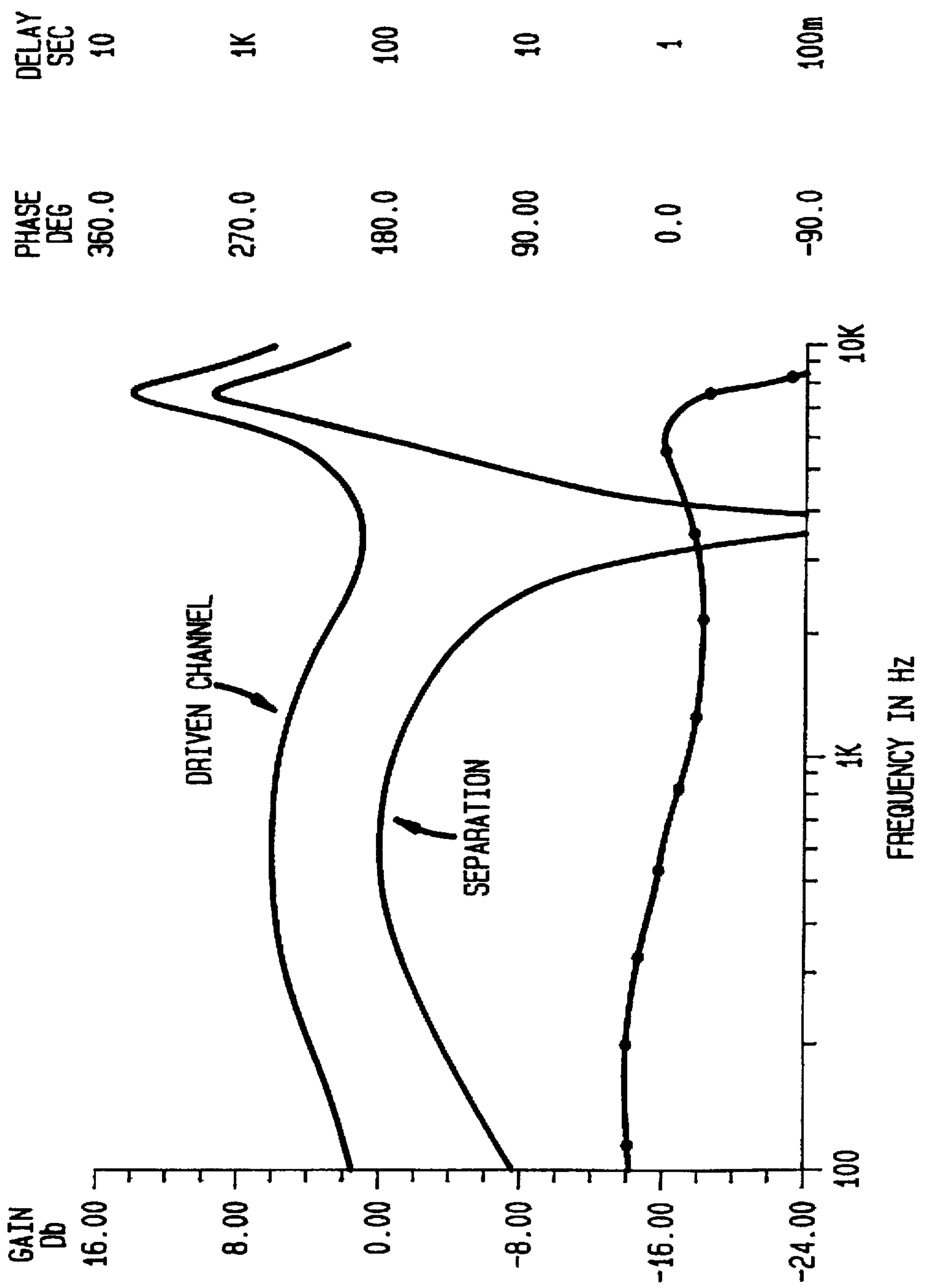
FIG. 11 shows response curves for various signals in the circuit of FIG. 10.

FIG. 11 shows response curves of the left and right channel outputs as well as the separation between the two channels.

The values of the circuit components used in FIGS. 2, 7 and 10 are as follows:

FIG. 2

| RESISTORS | VALUE (in ohms) |
|---|---|
| R1 | 39K |
| R2, R8, R10, R15, R27, R29 | 22K |
| R3, R5, R6, R7, R21, R22 | 10K |
| R4, R12, R13 | 1K |
| R9, R11, R20 | 39K |
| R14 | 100K |
| R16 | 27K |
| R17 | 12K |
| R18, R19 | 13K |
| R23, R24 | 15K |
| R25 | 7.5K |

-continued

| CAPACITORS | VALUE |
|---|---|
| C1, C3, C10, C11 | 5 μF |
| C2, C7, C9 | .0022 μF |
| C4, C5 | 820 PF |
| C6 | 100 μF |
| C8 | .033 μF |

FIG. 7

| RESISTORS | VALUE (in ohms) |
|---|---|
| R50, R54 | 22K |
| R51 | 12K |
| R52, R53, R55, R56, R63 | 10K |
| R57 | 47K |
| R58, R59 | 30K |
| R60 | 33K |
| R61, R62 | 1K |
| R64 | 6.8K |
| R65, R66 | 39K |
| R67, R69 | 4.7K |
| R68, R72 | 100K |
| R70, R71 | 20K |

| CAPACITORS | VALUE |
|---|---|
| C50, C52, C58, C59 | 5 μF |
| C51, C53 | .068 μF |
| C54 | 100 μF |
| C55 | 330 PF |
| C56 | .015 μF |
| C57 | 1200 PF |
| C60 | 1000 PF |

FIG. 10

| RESISTORS | VALUE (in ohms) |
|---|---|
| R100, R103 | 12K |
| R101, R112, R113 | 15K |
| R102, R104, R107, R108, R114, R115, R116, R117, R120, R121, R122, R124 | 10K |
| R105 | 5K |
| R106, R111 | 68K |
| R109 | 750 |
| R110 | 27K |
| R118, R119 | 1K |
| R123, R125 | 100K |

| CAPACITORS | VALUES |
|---|---|
| C100, C102, C110, C111 | 5 μF |
| C101 | 390 PF |
| C103, C104 | 22 NF |
| C105 | 33 NF |
| C106 | 750 PF |
| C107 | 15 NF |
| C108 | 100 μF |
| C109 | 120 PF |

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A circuit arrangement for improving the stereo image separation in a stereo signal comprising:

a first and a second input for receiving, respectively, a left and a right channel signal of an input stereo signal;

a summing and equalizing circuit having a first and a second input coupled, respectively, to said first and second inputs of said circuit arrangement, for receiving said left and right channel signals, means for summing the left and right channel signals thereby forming a sum signal, equalizing means for performing a high frequency equalization on said sum signal, and a first and a second output both for supplying the equalized sum signal;

a difference and equalizing circuit having a first and a second input coupled, respectively, to said first and second inputs, for receiving said left and right channel signals, means for subtracting the right channel signal from the left channel signal thereby forming a first difference signal, means for subtracting the left channel signal from the right channel signal thereby forming a second difference signal, means for performing an equalization on said first and second difference signals, said equalization having characteristics of an ear of a human being, and first and second outputs for providing, respectively, the equalized first difference signal and the equalized second difference signal;

first means for combining the first output of said summing and equalizing circuit with the first output of said difference and equalizing circuit, an output of said first combining means carrying a modified left channel signal and being coupled to a first output of said circuit arrangement; and second means for combining the second output of said summing and equalizing circuit with the second output of said difference and equalizing circuit, an output of said second combining means carrying a modified right channel signal and being coupled to a second output of said circuit arrangement.

2. A circuit arrangement for improving stereo image separation in a stereo signal comprising:

a first and a second input for receiving, respectively, a left and a right channel signal of an input stereo signal;

a summing and equalizing circuit having a first and a second input coupled, respectively, to said first and second inputs of said circuit arrangement, for receiving said left and right channel signals, means for summing the left and right channel signals thereby forming a sum signal, equalizing means for performing a high frequency equalization on said sum signal, and a first and a second output both for supplying the equalized sum signal;

a difference and equalizing circuit having a first and a second input coupled, respectively, to said first and second inputs, for receiving said left and right channel signals, means for subtracting the right channel signal from the left channel signal thereby forming a first difference signal, means for subtracting the left channel signal from the right channel signal thereby forming a second difference signal, means for performing an equalization on said first and second difference signals, said equalization having characteristics of an ear of a human being, and first and second outputs for providing, respectively, the equalized first difference signal and the equalized second difference signal;

first means for combining the first output of said summing and equalizing circuit with the first output of said difference and equalizing circuit, an output of said first combining means carrying a modified left channel signal and being coupled to a first output of said circuit arrangement; and second means for combining the second output of said summing and equalizing circuit with the second output of said difference and equalizing circuit, an output of said second combining means carrying a modified right channel signal and being coupled to a second output of said circuit arrangement, characterized in that:

said summing and equalizing circuit comprises a first operational amplifier having an inverting input to which the left and right channel signals are coupled, and means coupled to said first operational amplifier for causing said first operation amplifier to perform a high frequency equalization;

said difference and equalizing circuit comprises a second operational amplifier for inverting the right channel signal, a third operational amplifier having an inverting input to which the left and inverted right channel signals are coupled, means coupled to said third operational amplifier for causing said third operational amplifier to perform a mid-range equalization, a fourth operational amplifier having an inverting input coupled to receive the left and inverted right channel signals, and means coupled to said fourth operational amplifier for causing said fourth operational amplifier to perform a high-range equalization;

said first combining means comprises a fifth operational amplifier for forming a left channel output signal; and said second combining means comprises a sixth operational amplifier for forming a right channel output signal.

3. A circuit arrangement for improving stereo image separation in a stereo signal comprising:

a first and a second input for receiving, respectively, a left and a right channel signal of an input stereo signal;

a summing and equalizing circuit having a first and a second input coupled, respectively, to said first and second inputs of said circuit arrangement, for receiving said left and right channel signals, means for summing the left and right channel signals thereby forming a sum signal, equalizing means for performing a high frequency equalization on said sum signal, and a first and a second output both for supplying the equalized sum signal;

a difference and equalizing circuit having a first and a second input coupled, respectively, to said first and second inputs, for receiving said left and right channel signals, means for subtracting the right channel signal from the left channel signal thereby forming a first difference signal, means for subtracting the left channel signal from the right channel signal thereby forming a second difference signal, means for performing an equalization on said first and second difference signals, said equalization having characteristics of an ear of a human being, and first and second outputs for providing, respectively, the equalized first difference signal and the equalized second difference signal;

first means for combining the first output of said summing and equalizing circuit with the first output of said difference and equalizing circuit, an output of said first combining means carrying a modified left channel signal and being coupled to a first output of said circuit arrangement; and second means for combining the second output of said summing and equalizing circuit with the second output of said difference and equalizing circuit, an output of said second combining means carrying a modified right channel signal and being coupled to a second output of said circuit arrangement, characterized in that said summing and equalizing circuit comprises a first operational amplifier having an inverting input coupled to receive said left and right channel signals, and means coupled to said first operational amplifier for causing said first operational amplifier to perform a high frequency equalization;

said difference and equalizing circuit comprises a second operational amplifier having a non-inverting input coupled to receive said left channel signal and an inverting input coupled to receive said right channel signal, a third operational amplifier having an input coupled to receive an output from said second operational amplifier, and means coupled to said third operational amplifier for causing said third operational amplifier to perform a shelving and peaked low-pass filtering operation; and said second combining means comprises a fourth operational amplifier having a non-inverting input coupled to receive an output from said summing and equalizing circuit, and an inverting input coupled to receive an output from said difference and equalizing circuit.

4. A circuit arrangement for improving stereo image separation in a stereo signal comprising:

a first and a second input for receiving, respectively, a left and a right channel signal of an input stereo signal;

a summing and equalizing circuit having a first and a second input coupled, respectively, to said first and second inputs of said circuit arrangement, for receiving said left and right channel signals, means for summing the left and right channel signals thereby forming a sum signal, equalizing means for performing a high frequency equalization on said sum signal, and a first and a second output both for supplying the equalized sum signal;

a difference and equalizing circuit having a first and a second input coupled, respectively, to said first and second inputs, for receiving said left and right channel signals, means for subtracting the right channel signal from the left channel signal thereby forming a first difference signal, means for subtracting the left channel signal from the right channel signal thereby forming a second difference signal, means for performing an equalization on said first and second difference signals, said equalization having characteristics of an ear of a human being, and first and second outputs for providing, respectively, the equalized first difference signal and the equalized second difference signal;

first combining means for combining the first output of said summing and equalizing circuit with the first output of said difference and equalizing circuit, an output of said first combining means being coupled to a first output of said circuit arrangement;

second combining means for combining the second output of said summing and equalizing circuit with the second output of said difference and equalizing circuit, an output of said second combining means being coupled to a second output of said circuit arrangement;

wherein the outputs of said first and second combining means each carry equalized left channel and right channel signals, the equalized left channel signal of the output of said first combining means being selectively greater in amplitude than the equalized left channel signal of the output of said second combining means as a function of frequency, and the equalized right channel signal of the output of said first combining means being selectively lesser in amplitude than the equalized right channel signal of the output of said second combining means as a function of frequency, thereby providing amplitude differences between the outputs of said first and second combining means for respective left channel and right channel signals that improve stereo image separation.

* * * * *